United States Patent [19]
Robinson et al.

[11] Patent Number: 5,138,277
[45] Date of Patent: Aug. 11, 1992

[54] SIGNAL PROCESSING SYSTEM HAVING A VERY LONG TIME CONSTANT

[75] Inventors: Kermit H. Robinson, Hanover; Daniel M. Seslar, Weymouth, both of Mass.

[73] Assignee: Hazeltine Corp., Greelawn, N.Y.

[21] Appl. No.: 589,239

[22] Filed: Sep. 28, 1990

[51] Int. Cl.$^5$ .............................................. H03G 3/10
[52] U.S. Cl. ..................................... 330/281; 330/284; 330/290
[58] Field of Search ..................... 330/281, 284, 290

[56] References Cited

FOREIGN PATENT DOCUMENTS 62-144413  6/1987  Japan .................................. 330/281

Primary Examiner—Eugene R. LaRoche
Assistant Examiner—R. Ratliff
Attorney, Agent, or Firm—Edward A. Onders

[57] ABSTRACT

A switched capacitor integrator is used within the feedback loop of an automatic gain control (AGC) circuit to provide a very long time constant (5 minutes or more) when the amplitude of the gain-controlled signal is within predetermined limits. The time constant is automatically and quickly changed to a much shorter value when the gain-controlled signal is outside the predetermined limits, thereby allowing the AGC circuit to rapidly bring the gain-controlled signal amplitude within the desired range between the predetermined limits. Time constants of orders of magnitude longer than those readily realized with prior art methods of long time-constant filtering are achieved.

3 Claims, 1 Drawing Sheet

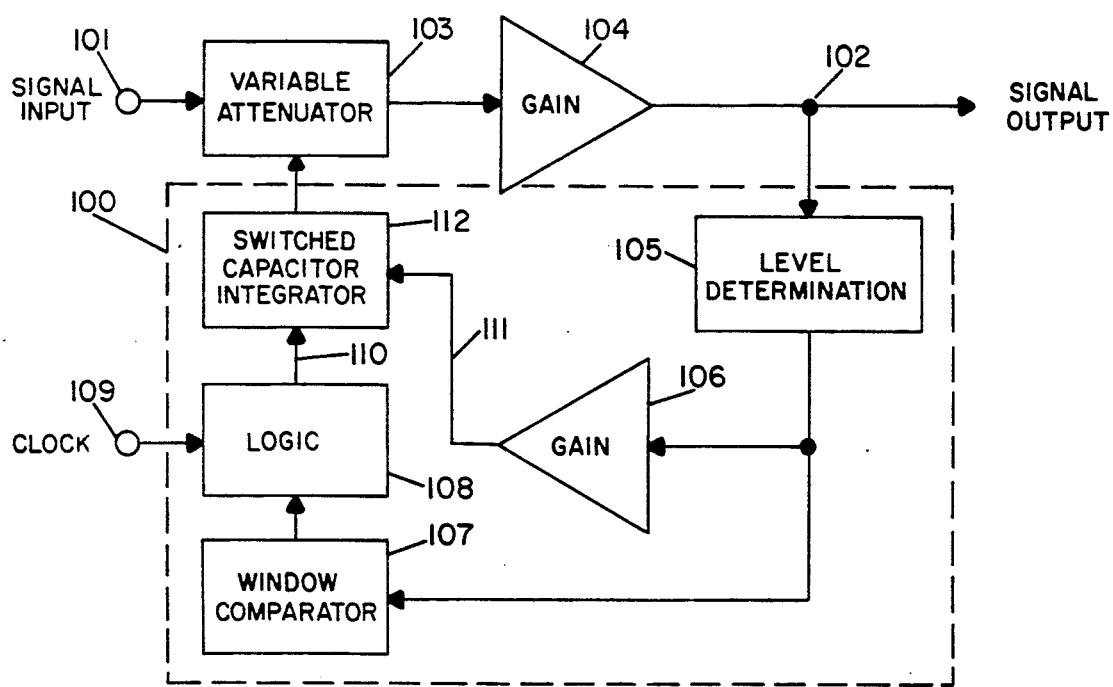

SIGNAL PROCESSING SYSTEM HAVING A VERY LONG TIME CONSTANT

This invention was made with Government support under Contract No. N00019-87-C-0290, awarded by the Department of the Navy. The Government has certain rights in this invention.

FIELD OF THE INVENTION

This invention relates to electronic signal processing systems in general, and, more particularly, to automatic gain control (AGC) apparatus in receivers of signals which require integration of the gain-controlled signal over very long periods of time. One application for such receivers is in sound-navigation-and-ranging (sonar) systems.

BACKGROUND OF THE INVENTION

In certain types of electronic systems designed for the transmission and reception of acoustic or electromagnetic signals, the algorithms of the intelligence carried in the received signal are of such a nature that, in order for receivers to detect the intelligence with integrity, the receiver's automatic gain control (AGC) circuit must have a substantially long time constant, i.e. five or more minutes may be required. Sonar is an example of technology having the described signal requirements. However, it is also desirable to have a much shorter time constant if the amplitude of the gain-controlled signal significantly departs from the nominal desired amplitude level, such as, for example, by more than 3 dB. Previously, very long AGC time constants have not been sucessfully achieved by conventional means.

It is, therefore, an object of the present invention to provide new and improved signal processing systems, including AGC circuits, having very long time constants.

It is another object of the present invention to provide such systems wherein the time constant can be rapidly switched between one which is very long and one which is much shorter.

SUMMARY OF THE INVENTION

In accordance with one aspect of the present invention, there is provided signal processing system including means for supplying an input signal and means for processing the input signal to generate an output signal. The means for processing includes a switched capacitor integrator, and the processing exhibits a long time constant when the output signal is substantially within a first output signal range.

In accordance with another aspect of the invention, there is provided an improved automatic gain control system having an input signal and an output signal having a predetermined range. The automatic gain control system includes means for varying the amplitude of the input signal to generate the output signal and means for coupling the output signal to the means for varying. The means for coupling includes means for developing a direct current signal proportional to the amplitude of the output signal, means for comparing the direct current signal with the predetermined output range, a switched capacitor integrator for responding with a long time constant when the direct current signal is within the predetermined output range, and means for coupling the output of the switched capacitor integrator to the means for varying, to control the means for varying.

In accordance with still another aspect of the invention, there is provided a signal processing system having at least first and second time constants, and an output signal with at least a first output range. The signal processing system includes means for supplying an input signal and means for processing the input signal to generate an output signal. The means for processing switches from the first time constant to the second time constant when the output signal is within the first output range, and further switches from the second time constant to the first time constant when the output signal is not within the first output range.

In accordance with another aspect of the invention, there is provided an improved automatic gain control system having an input signal and an output signal having a desired range. The automatic gain control system includes means for varying the amplitude of the input signal to generate the output signal and means for coupling the output signal to the means for varying. The means for coupling includes means for developing a direct current signal proportional to the amplitude of the output signal, means for comparing the direct current signal with the predetermined output range, a switched capacitor integrator responsive to the direct current signal, and means for coupling the output of the switched capacitor integrator to the means for varying, to control the means for varying. The switched capacitor integrator includes means for responding with a first or second time constant and means for switching from the first time constant to the second time constant when the output signal is substantially within the predetermined output range, and switching from the second time constant to the first time constant when the output signal is not substantially within the predetermined output range.

For a better understanding of the present invention, together with other and further objects, reference is made to the following description, taken in conjunction with the accompanying drawing, and its scope will be pointed out in the appended claims.

BRIEF DESCRIPTION OF THE DRAWING

The drawing is a functional block diagram of a portion of a receiver which embodies the invention.

DETAILED DESCRIPTION OF THE INVENTION

The drawing is a block diagram of that portion of a receiver which includes an AGC'd signal path and its associated AGC feedback loop, which incorporates a switched capacitor integrator. The signal to be automatically gain controlled is supplied to input terminal 101, where it is coupled to the signal path comprising a variable attenuator 103 cascaded with an amplifier depicted by gain block 104. The gain-controlled output of this signal path appears at output terminal 102. The automatic gain control (AGC) feedback loop incorporating features of the invention is contained within dotted box 100.

In the signal path, variable attenuator 103 is responsive to an essentially dc feedback gain-control signal (hereinafter referred to as the automatic gain control, or AGC, signal) coupled from switched capacitor integrator 112 to variable attenuator 103's control-signal input. The manner in which the AGC control signal is used to adjust the gain of variable attenuator 103 to maintain the amplitude of the output signal at terminal 102 essentially independent of changes in input signal amplitude at terminal 101 is well known to those skilled in the art.

The attenuation introduced in the signal path by variable attenuator 103, input to output, is a smooth and continuous function of the AGC control signal coupled to its control input, thus providing a non-discrete, continuous gain response of the AGC circuit. The non-discrete response is an important attribute in preserving the fidelity of the signal supplied to input terminal 101. The dynamic range of one actual embodiment of the invention was approximately 40 dB.

Signal gain, provided by amplifier 104, scales the output signal appearing at terminal 102 and the dynamic range of the input signal supplied to input terminal 101. Gain function 104 and the variable attenuation of block 103 may be combined in one device, such as a MOSFET, for example. A type 2N7002 MOSFET was used in one embodiment of the invention.

The gain-controlled output signal at output terminal 102 of the signal path is also coupled to the input of level determination circuit 105, which converts the root-mean-square (RMS) level of the output signal to a dc gain control feedback signal (the AGC control signal). While a preferred embodiment of the invention employed an RMS detector for unit 105, other forms of detection, such as, for example, peak or average detection are usable. These types of detectors are well known to those skilled in the art.

The AGC control signal output from level determination circuit 105 is coupled to the inputs of the AGC control signal gain block (amplifier) 106 and window comparator 107. The feedback gain function 106, if required, scales the input signal-dynamic range. The AGC control signal output of gain block 106 is coupled via lead 111 to the signal input of switched capacitor integrator 112, whose operation is described below.

As noted above, the AGC control signal output from level determination circuit 105 is also coupled to window comparator 107. The window comparator defines an operational window for the amplitude of the gain-controlled output signal at terminal 102. If the output signal is outside of this window, a fast AGC response time constant is selected so as to quickly return the signal to within the operational range, at which time the AGC response time-constant is automatically returned to its much longer value.

Specifically, window comparator 107 automatically determines whether the AGC control signal amplitude at its input is within, or outside, the range between predetermined upper and lower limits. Its output, coupled to logic block 108, is a control signal which determines the duty cycle of the switching signal output, on lead 110, from logic block 108. When the AGC control signal amplitude at the input to comparator 107 is within the range between the two predetermined "window" limits, the control signal output of the comparator causes the logic circuit in block 108 to produce an output switching signal on lead 110 which has a duty cycle that causes switched capacitor integrator 112 to have a substantially long time constant, of the order of five minutes, or even more. If the input signal amplitude to comparator 107 is outside the range between the comparator's predetermined "window" limits, the comparator's output control signal causes the output switching signal of logic circuit 108 to have a duty cycle which causes switched capacitor integrator 112 to have a relatively short time constant.

Logic circuit 108 requires a clock signal input at port 109. Suitable window comparators and logic circuits for performing the functions just described are familiar to those skilled in the art. In one embodiment of the invention, a clock signal repetition frequency of 2 kilohertz was used, and the duty cycle (ratio of pulse width to period) of the output switching signal from logic block 108 was 1:144 when the AGC control signal amplitude was within the "window", and of the order of 100:144 when it was outside the window limits. The window limits were set so that the AGC time constant was at its shorter value, with short attack and decay times, until the gain controlled signal amplitude was within 3 dB of its nominal operation value, at which time the longer time constant, with its longer attack and decay times, was selected. While the foregoing values of parameters were used in one embodiment, other values are usable, as will be recognized by those skilled in the art.

In the aforementioned embodiment of the invention, logic block 108 had a single switching signal output on lead 110. However, as is well known to those skilled in the art, other implementations of switched capacitor integrator 112 may require a plurality of switching signal outputs.

Block 112 contains a switched capacitor filter configured as an integrator. As is well known to those skilled in the art, a switched capacitor integrator (SCI) has a signal path with signal input and output ports, and a switching signal input port; the integration time constant of the signal path is a function of the duty cycle of the input signal supplied to the switching signal input port. The time constant decreases with an increase in duty cycle of the pulse switching signal input on lead 110 to the SCI. Thus, as has already been described, when the AGC control signal amplitude at the input of window comparator 107 is outside the range between predetermined window limits, comparator 107 and logic 108 work together to produce a relatively large (or long) duty cycle of the switching signal on lead 110 to the input port of SCI 112, and thereby produce a short integration time constant in the SCI signal path. Conversely, when the AGC control signal amplitude is within the "window" limits, the duty cycle of the switching signal on lead 110 to the SCI switching signal input port is much smaller (shorter), thereby producing a comparatively longer time constant in the SCI signal path. The reasons for, and usage of, the automatically selectable time constants has already been described.

Switched capacitor filter technology is well known to those skilled in the art. In one embodiment of the invention a CMOS 74HC4316 Quad Analog Switch/Multiplexer/Demultiplexer was used in the SCI, 112. However, other SCI implementations are possible.

The AGC control signal output from SCI 112 is coupled to the control signal input of variable attenuator 103, as has already been described, and the AGC control signal adjusts the amount of attenuation introduced by attenuator 103 in a manner which, in conjunction with the gain provided by amplifier 104 maintains the amplitude of the output signal at terminal 102 essentially independent of input signal amplitude variations at input terminal 101 in a manner well known to those skilled in the art. The dynamic range of such an AGC circuit may be typically 40 dB.

While there has been described what is at present considered to be the preferred embodiment of this invention, it will be obvious to those skilled in the art that various changes and modifications may be made therein without departing from the invention and it is, therefore, aimed to cover all such changes and modifications as fall within the true spirit and scope of the invention.

What is claimed is:

1. An automatic gain control (AGC) system having an input signal and an output signal having a desired range, comprising:

means for varying the amplitude of said input signal to generate said output signal; and means for coupling said output signal to said means for varying, comprising:

means for developing a direct current signal proportional to the amplitude of said output signal;

means for comparing said direct current signal with said predetermined output range;

a switched capacitor integrator responsive to said direct current signal, comprising:

means for responding with a first or second time constant; and means for switching from said first time constant to said second time constant when said output signal is substantially within said predetermined output range, and switching from said second time constant to said first time constant when said output signal is not substantially within said predetermined output range; and means for coupling the output of said switched capacitor integrator to said means for varying, whereby said means for varying is controlled.

2. The automatic gain control (AGC) system of claim 1, wherein said first time constant is short with respect to said second time constant.

3. The automatic gain control (AGC) system of claim 2, wherein said second time constant is long with respect to said first time constant.

* * * * *